United States Patent
Rzehak et al.

(10) Patent No.: US 7,589,516 B2
(45) Date of Patent: Sep. 15, 2009

(54) POLY-PHASE ELECTRIC ENERGY METER

(75) Inventors: Volker Rzehak, Ergolding (DE); Vincent Wei Chit Chan, Hong Kong (CN); Stephen James Underwood, Hong Kong (CN); Thomas Hung Lam Kot, Hong Kong (CN)

(73) Assignee: Texas Instruments Incorporated, Dallas, TX (US)

( * ) Notice: Subject to any disclaimer, the term of this patent is extended or adjusted under 35 U.S.C. 154(b) by 84 days.

(21) Appl. No.: 11/961,422

(22) Filed: Dec. 20, 2007

(65) Prior Publication Data

US 2008/0186013 A1 Aug. 7, 2008

(30) Foreign Application Priority Data

Jan. 5, 2007 (DE) .................. 10 2007 001 219

(51) Int. Cl.
*G01R 19/00* (2006.01)
(52) U.S. Cl. ...................................... 324/107
(58) Field of Classification Search ............... 324/107, 324/142; 702/57, 60, 64, 65
See application file for complete search history.

(56) References Cited

U.S. PATENT DOCUMENTS

| | | | | |
|---|---|---|---|---|
| 5,691,634 A * | 11/1997 | Lowe | ............... | 324/107 |
| 6,112,159 A | 8/2000 | Bond et al. | | |
| 6,275,021 B1 | 8/2001 | Windsheimer | | |
| 6,377,037 B1 | 4/2002 | Burns et al. | | |
| 6,483,290 B1 | 11/2002 | Hemminger et al. | | |
| 6,657,424 B1 * | 12/2003 | Voisine et al. | ............ | 324/76.11 |
| 6,983,211 B2 * | 1/2006 | Macfarlene et al. | ........... | 702/61 |
| 7,218,122 B1 * | 5/2007 | Nastasi et al. | ............... | 324/620 |
| 7,474,087 B2 * | 1/2009 | Fritz | ......................... | 324/142 |
| 2003/0036864 A1 | 2/2003 | Randall et al. | | |
| 2004/0032357 A1 | 2/2004 | White | | |
| 2004/0183522 A1 * | 9/2004 | Gunn et al. | ................. | 324/126 |
| 2004/0186672 A1 | 9/2004 | Howell et al. | | |
| 2005/0134490 A1 * | 6/2005 | Cox | .......................... | 341/141 |
| 2005/0225469 A1 | 10/2005 | White | | |

FOREIGN PATENT DOCUMENTS

| | | |
|---|---|---|
| DE | 197 13 120 C1 | 10/1998 |
| EP | 1 545 009 A2 | 6/2005 |
| WO | WO 98/44355 A | 10/1998 |
| WO | WO 99/44071 A | 9/1999 |
| WO | WO 01/77695 A | 10/2001 |

* cited by examiner

*Primary Examiner*—Ha Tran T Nguyen
*Assistant Examiner*—Joshua Benitez
(74) *Attorney, Agent, or Firm*—Robert D. Marshall, Jr.; Wade J. Brady, III; Frederick J. Telecky, Jr.

(57) ABSTRACT

A poly-phase electric energy meter comprises a front-end that converts analog current input signals and analog voltage input signals to digital current and voltage samples and a micro-controller for computing power consumed. The front end includes first and second input channels. Each input channel has a multiplexer, an analog-digital converter, a de-multiplexer and a set of data registers. The first input channel receives current input and the second input channel receives voltage inputs. A multiplexer control causes the first and second channels to sequentially sample the current and voltage for one phase at a time and store digital data in corresponding data registers. The micro-controller computes energy consumed from the simultaneous current and voltage samples.

4 Claims, 2 Drawing Sheets

POLY-PHASE ELECTRIC ENERGY METER

CLAIM OF PRIORITY

This application claims priority under 35 U.S.C. 119(a) to German Patent Application No. 10 2007 001 219.7 filed Jan. 5, 2006.

TECHNICAL FIELD OF THE INVENTION

The technical field of this invention is poly-phase electric energy meters.

BACKGROUND OF THE INVENTION

In a typical three-phase electric energy meter current input signals for the three phases come from current transformers and voltage input signals from the three phases via resistive voltage divider. The current and voltage input signals are sampled and the current samples are multiplied with the voltage samples to obtain electric energy samples. Accumulating these energy samples provides an indication of consumed electric energy.

In an advanced electric energy meter the current and voltage input signals are converted to digital input samples for further processing by a micro-controller. One straight-forward approach uses separate input channels, for each of the three current and voltage input signals including an analog-digital converter (ADC). In this "synchronous" approach all input signals are processed in parallel and synchronously. An application having a high accuracy requirements over a large dynamic range, such as permitted error less than 1% over a range of 1:2000, high-resolution ADCs of at least 16 bits are needed. These ADCs usually include a sigma-delta modulator followed by a decimation filter. While this approach is successful, it requires a large die space and is expensive. An alternative approach uses a single high-resolution ADC with an input multiplexer and an output de-multiplexer. In this "sequential" approach the current and voltage input signals are sequentially switched to the input of the ADC and the resulting digital samples are corrected in phase to compensate for the delays introduced by the sequential sampling. The sequential approach needs less die space for the ADC but requires a complicated phase adjustment between the successively obtained current and voltage samples.

SUMMARY OF THE INVENTION

The present invention is a poly-phase electric energy meter comprising a micro-controller with a front-end that needs only two ADCs and requires no phase adjustment between pairs of corresponding current and voltage samples.

The poly-phase electric energy meter of this invention comprises a micro-controller with a front end that converts analog current input signals and analog voltage input signals to digital current and voltage samples for processing by the micro-controller. The front end includes a first input channel for all current input signals with a multiplexer, an analog-digital converter and a de-multiplexer and a second input channel for all voltage input signals with a multiplexer, an analog-digital converter and a de-multiplexer. The first and second input channel multiplexers and de-multiplexers operate synchronously. The first and second input channels provide the digital current and voltage samples for processing by the micro-controller. No phase adjustments are necessary between pairs of corresponding current and voltage samples because the digital samples of the current and voltage input signals are obtained in synchronism. This pair of ADCs is shared among the three phases in a three-phase meter.

In a preferred embodiment, the multiplexer in the second input channel has one input for each voltage input signal and at least one additional input for an auxiliary input signal such as a temperature signal or a battery voltage signal. Depending on the required sample rate additional time slots can be implemented so that more than just one voltage input signal can be processed in the single common input channel.

In an application that also measures neutral current addition to the three live currents, the multiplexer in the first input channel has one input for each current input signal and an additional input for the current input signal from a current transformer in the neutral line.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
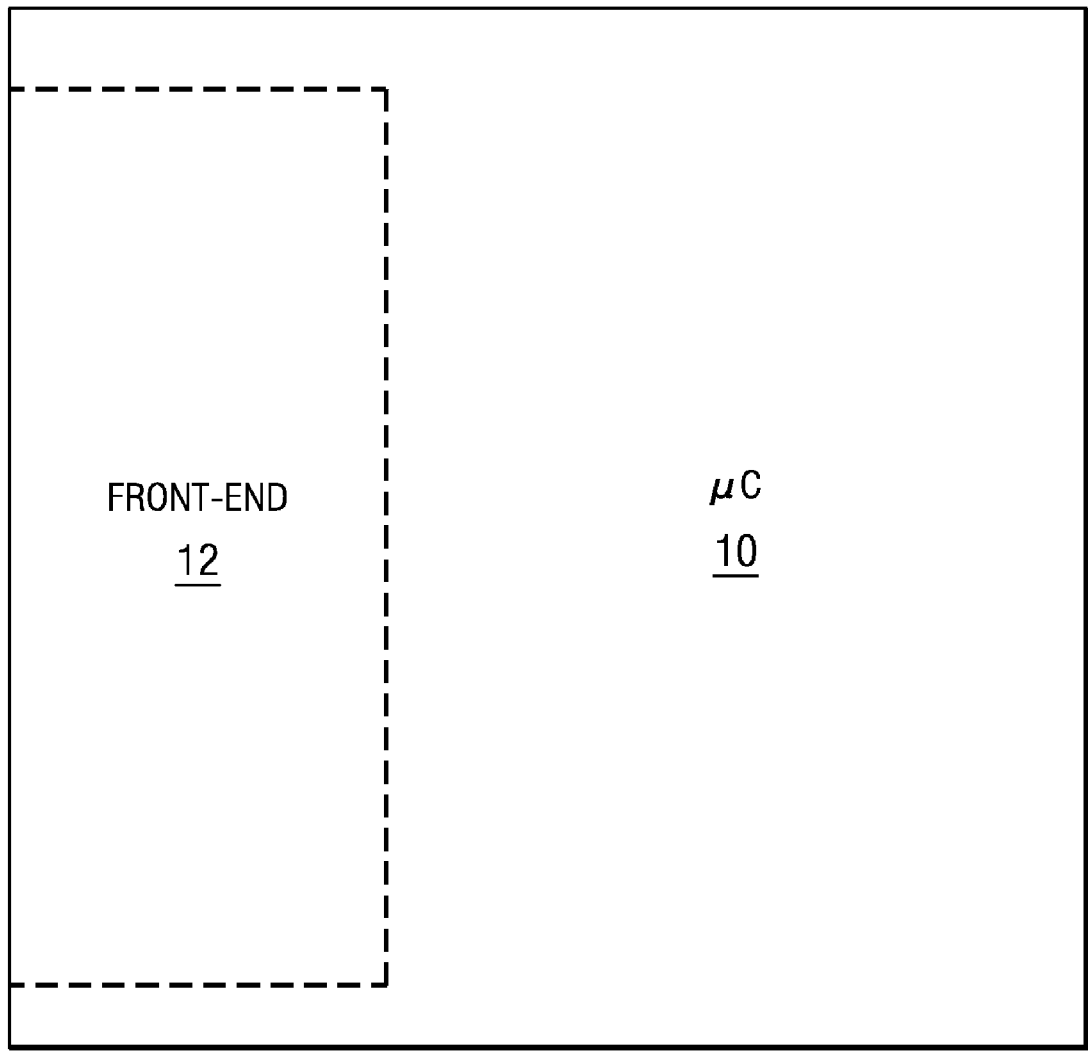
FIG. 1 is a schematic block diagram of a micro-controller incorporating a front-end.

FIG. 1 illustrates micro-controller 10. Micro-controller 10 includes a front-end 12 which has a plurality of analog inputs and a plurality of digital outputs. The analog inputs receive external analog input signals and the digital outputs are internal to micro-controller 10. Micro-controller 10 processes these digital outputs of front-end 12.

Figure 2:
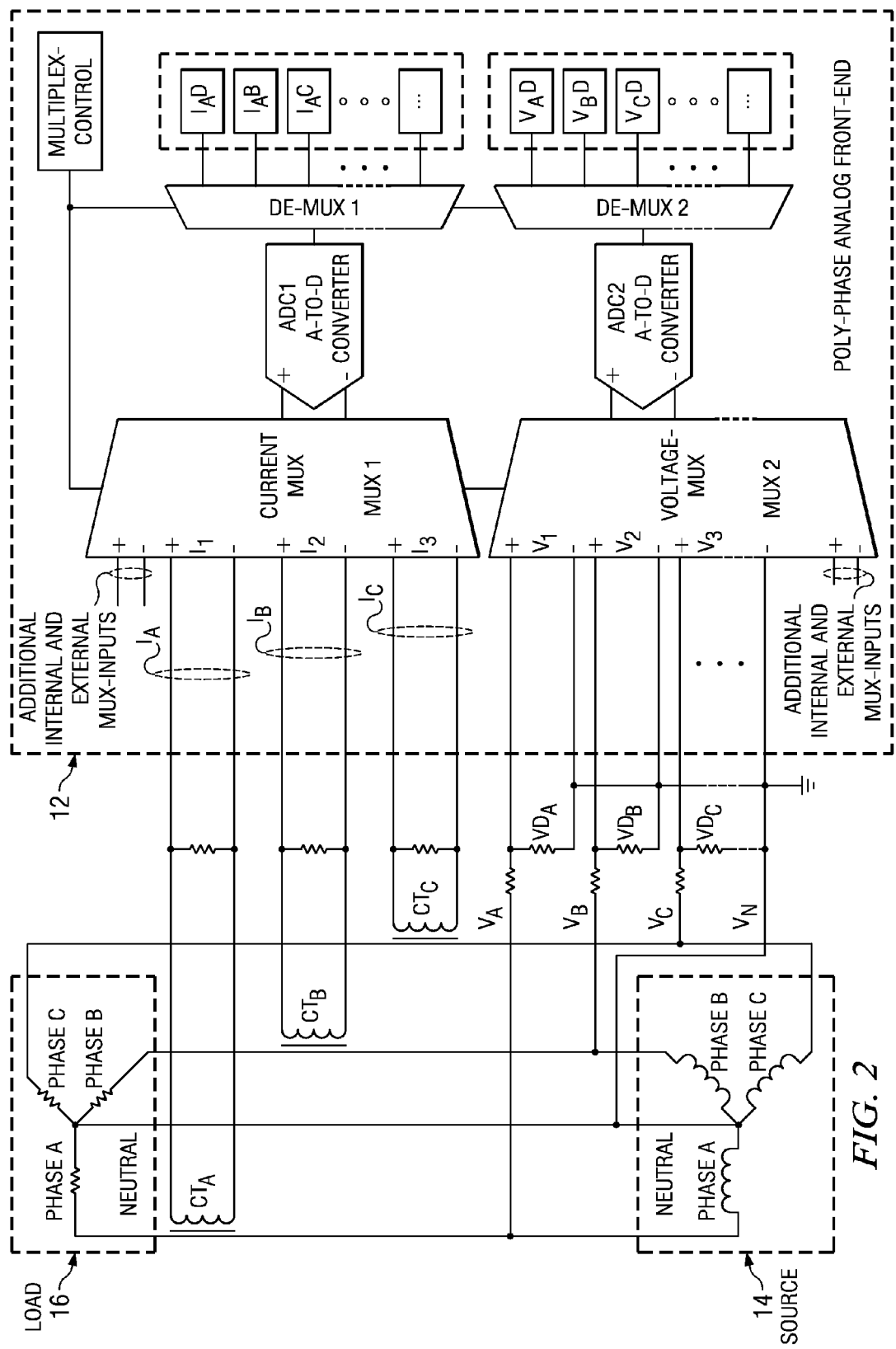
FIG. 2 is a block diagram of a poly-phase electric energy meter implemented with a micro-controller as illustrated in FIG. 1.

FIG. 2 illustrates details of front-end 12. Front-end 12 includes two input channels each including a multiplexer, an analog-to digital converter ADC and a de-multiplexer. The first input channel front-end 12 includes first multiplexer MUX1 that has three analog inputs receiving respective current input signals $I_A$, $I_B$, and k. The output of multiplexer MUX1 supplies the input of analog-to-digital converter ADC1. The digital output analog-to-digital converter ADC1 is connected to de-multiplexer De-MUX1. De-multiplexer De-MUX1 provides three respective digital current samples $I_{AD}$, $I_{BD}$ and $I_{CD}$. These digital current samples are stored in corresponding data registers for digital current samples $I_{AD}$, $I_{BD}$ and $I_{CD}$. These data registers are accessible by micro-controller 10. Multiplexer MUX1 may have additional inputs and if so de-multiplexer De-MUX1 provides corresponding additional output samples to corresponding additional data registers.

The front-end 12 further includes a second input channel including multiplexer MUX2. Multiplexer MUX2 has four analog inputs receiving respective voltage input signals $V_A$, $V_B$, Vc and $V_N$, and optional additional inputs for application of auxiliary external or internal signals. The output of multiplexer MUX1 supplies the input of analog-to-digital converter ADC2. Analog-to-digital converter ADC2 produces a digital output which is connected to de-multiplexer De-MUX2. De-multiplexer De-MUX2 provides three respective digital voltage samples $V_{AD}$, $V_{BD}$ and $V_{CD}$, and one or more optional samples. These digital current samples and optional additional signals are stored in corresponding data registers for digital current samples $V_{AD}$, $V_{BD}$ and $V_{CD}$ and the additional sampled. These data registers are accessible by micro-controller 10.

Front-end 12 includes multiplex control which synchronizes operation of all multiplexers and de-multiplexers.

The electric energy meter is connected to the three phases A, B and C of a three-phase power source 14 which feeds a three-phase load 16. Each phase has an associated current transformer $CT_A$, $CT_B$ and $CT_B$ and an associated resistive voltage divider $VD_A$, $VD_B$ and VDc. In a well-known manner, the current transformers $CT_A$, $CT_B$ and $CT_B$ generate respective current input signals $I_A$, $I_B$ and $I_C$, and the voltage dividers $VD_A$, $VD_B$ and VDc produce respective voltage input signals $V_A$, $V_B$, $V_C$. Neutral voltage signal $V_N$ is applied directly to a corresponding input of multiplexer MUX2. Optional input signals such as external parameters (temperature, battery voltage, etc.) or internal analog signals are applied to further inputs of multiplexer MUX2. Likewise, an additional current input signal derived from an additional current transformer in the neutral line may be applied to a further input of multiplexer MUX1.

In operation, the analog current and voltage input signals are converted to digital samples for further processing by the micro-controller. Current input signals are sequentially applied to ADC1 and de-multiplexer DE-MUX1 stores corresponding digital current samples $I_{AD}$, $I_{BD}$ and $I_{CD}$ in data registers available to micro-controller 10. Likewise, voltage input signals are sequentially applied to ADC2 and corresponding digital voltage samples $V_{AD}$, $V_{BD}$ and $V_{CD}$ and de-multiplexer De-MUX2 stores corresponding digital voltage samples $V_{AD}$, $V_{BD}$ and $V_{CD}$ in data registers available to micro-controller 10. Since the samples in the two input channels are synchronized, pairs of corresponding current and voltage samples can be further processed by the micro-controller without phase adjustment between the samples of the pair. This process is known in the art and includes multiplication of the corresponding digital current and voltage samples and accumulation of the product over time. No phase correction is required in the micro-controller because the current and voltage of each phase are sampled synchronously.

What is claimed is:

1. An electric energy meter for poly-phase electricity comprising:
    a front-end circuit including
        a first input channel having
            a first multiplexer having a plurality of inputs, each input connected to a current transformer of a corresponding one of the phases of the poly-phase electricity, an output and a selection input, said first multiplexer selectively connecting one input to said output dependent upon said selection input,
            a first analog-digital converter having an input connected to said output of said first multiplexer and an output, said first analog-digital converter generating a digital output corresponding to an analog signal at said input,
            a first de-multiplexer having an input connected to said output of said first analog-to-digital converter, a plurality of outputs and a selection input, said first de-multiplexer connecting said input to one of said outputs dependent upon said selection input, and
            a plurality of first data registers, each data register connected to a corresponding output of said first de-multiplexer for storing said corresponding de-multiplexer output;
        a second input channel having
            a second multiplexer having a plurality of inputs, each input connected to a voltage divider of a corresponding one of the phases of the poly-phase electricity, an output and a selection input, said second multiplexer selectively connecting one input to said output dependent upon said selection input,
            a second analog-digital converter having an input connected to said output of said second multiplexer and an output, said second analog-digital converter generating a digital output corresponding to an analog signal at said input,
            a second de-multiplexer having an input connected to said output of said second analog-to-digital converter, a plurality of outputs and a selection input, said second de-multiplexer connecting said input to one of said outputs dependent upon said selection input, and
            a plurality of second data registers, each data register connected to a corresponding output of said second de-multiplexer for storing said corresponding de-multiplexer output;
        a multiplexer control connected to said selection inputs of said first and second multiplexers and said first and second de-multiplexers, said multiplexer control supplying said selection inputs of said first and second multiplexers to synchronously select signals corresponding to the same phase of the poly-phase electricity, and said multiplexer control supplying said selection inputs of said first and second de-multiplexers to sequentially store digital samples corresponding to each phase of the poly-phase electricity in corresponding data registers; and
    a micro-controller operable to access data in said first and second data registers and computer electric power consumed.

2. The electric energy meter according to claim 1, wherein:
    said second multiplexer further includes at least one additional input for an analog auxiliary input signal;
    said second de-multiplexer further includes at least one additional output for said auxiliary input signal;
    said second data registers further include at an additional data register connected to each additional output of said second de-multiplexer; and
    said multiplexer control further supplying selection inputs to said second multiplexer and said second de-multiplexer to sample each analog auxiliary input signal and store a corresponding digital auxiliary input signal in a corresponding second data register.

3. The electric energy meter according to claim 1, wherein:
    said first multiplexer further includes at least one additional input for an analog auxiliary input signal;
    said first de-multiplexer further includes at least one additional output for said auxiliary input signal;
    said first data registers further include at an additional data register connected to each additional output of said first de-multiplexer; and
    said multiplexer control further supplying selection inputs to said first multiplexer and said first de-multiplexer to sample each analog auxiliary input signal and store a corresponding digital auxiliary input signal in a corresponding first data register.

4. The electric energy meter according to claim 1, wherein:
    said micro-controller computes computer electric power consumed by
        recalling digital current data from one of said first data registers,
        recalling digital voltage data from one of said second data registers corresponding to the same phase of the poly-phase electricity as said recalled digital current data,
        multiplying said recalled digital current data and said recalled digital voltage data thereby producing a power product, and
        accumulating said power products over time.

* * * * *